US012235302B2

(12) United States Patent
DeAngelis et al.

(10) Patent No.: US 12,235,302 B2
(45) Date of Patent: Feb. 25, 2025

(54) METHODS OF DETECTING CONNECTION ISSUES BETWEEN A WIRE BONDING TOOL AND AN ULTRASONIC TRANSDUCER OF A WIRE BONDING MACHINE

(71) Applicant: Kulicke and Soffa Industries, Inc., Fort Washington, PA (US)

(72) Inventors: Dominick Albert DeAngelis, Villanova, PA (US); Gary Walter Schulze, Bethlehem, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 552 days.

(21) Appl. No.: 17/544,677

(22) Filed: Dec. 7, 2021

(65) Prior Publication Data

US 2022/0187353 A1    Jun. 16, 2022

Related U.S. Application Data

(60) Provisional application No. 63/126,328, filed on Dec. 16, 2020.

(51) Int. Cl.
*G01R 27/16*  (2006.01)
*H01L 21/66*  (2006.01)
*H01L 23/00*  (2006.01)

(52) U.S. Cl.
CPC .............. *G01R 27/16* (2013.01); *H01L 22/14* (2013.01); *H01L 24/78* (2013.01); *H01L 2224/85205* (2013.01)

(58) Field of Classification Search
CPC ......... G01R 27/16; H01L 22/14; H01L 24/78; H01L 2224/85205; H01L 2224/78308; H01L 2224/78343; H01L 2224/789; H01L 2224/859; G01M 13/00; B23K 37/00
See application file for complete search history.

(56) References Cited

U.S. PATENT DOCUMENTS

2018/0369952 A1* 12/2018 Hunstig ................. H01L 24/78
2019/0214363 A1*  7/2019 Klaerner .............. B23K 20/26
2020/0043883 A1*  2/2020 Eacock ................ B06B 1/0223

* cited by examiner

*Primary Examiner* — Mohammed R Alam
(74) *Attorney, Agent, or Firm* — Christopher M. Spletzer, Sr.

(57) ABSTRACT

A method of detecting potential issues in connection with engagement between a wire bonding tool and an ultrasonic transducer of a wire bonding machine is provided. The method includes the steps of: (a) providing electrical power to an ultrasonic transducer at each of a plurality of levels of electrical power; (b) detecting an electrical characteristic of the ultrasonic transducer at each of the plurality of levels of electrical power; and (c) determining if the electrical characteristic of the ultrasonic transducer at each of the plurality of levels of electrical power is acceptable.

21 Claims, 7 Drawing Sheets

METHODS OF DETECTING CONNECTION ISSUES BETWEEN A WIRE BONDING TOOL AND AN ULTRASONIC TRANSDUCER OF A WIRE BONDING MACHINE

CROSS-REFERENCE TO RELATED APPLICATION

This application claims the benefit of U.S. Provisional Patent Application No. 63/126,328 filed Dec. 16, 2020, the content of which is incorporated herein by reference.

FIELD

The invention relates to wire bonding systems, and more particularly, to improved methods of detecting connection issues between wire bonding tools and ultrasonic transducers on wire bonding machines.

BACKGROUND

In the assembly of semiconductor devices, wire bonding continues to be the primary method of providing electrical interconnection between two locations (e.g., between a die pad of a semiconductor die and a lead of a leadframe). To form wire loops to provide this interconnection, wire bonding tools are used.

In connection with a wire bonding process, a wire bonding tool is coupled to (or otherwise engaged with) an ultrasonic transducer of the wire bonding machine. For example, a wire bonding tool (e.g., a capillary) is secured in place (i.e., engaged) in a hole of the ultrasonic transducer using a screw.

If the gripping between the wire bonding tool and the ultrasonic transducer degrades, or otherwise changes, it may result in undesirable wire bonding results (e.g., inconsistent bond quality, etc.).

Thus, it would be desirable to provide improved methods of detecting connection issues between wire bonding tools and ultrasonic transducers on wire bonding machines.

SUMMARY

According to an exemplary embodiment of the invention, a method of detecting potential issues in connection with engagement between a wire bonding tool and an ultrasonic transducer of a wire bonding machine is provided. The method includes the steps of: (a) providing electrical power to an ultrasonic transducer at each of a plurality of levels of electrical power; (b) detecting an electrical characteristic of the ultrasonic transducer at each of the plurality of levels of electrical power; and (c) determining if the electrical characteristic of the ultrasonic transducer at each of the plurality of levels of electrical power is acceptable.

According to another exemplary embodiment of the invention, a method of detecting potential issues in connection with engagement between a wire bonding tool and an ultrasonic transducer of a wire bonding machine is provided. The method includes the steps of: (a) providing electrical current to an ultrasonic transducer at each of a plurality of levels of electrical current; (b) detecting an impedance characteristic of the ultrasonic transducer at each of the plurality of levels of electrical current; and (c) determining if the impedance characteristic of the ultrasonic transducer at each of the plurality of levels of electrical current is acceptable.

According to yet another exemplary embodiment of the invention, a method of detecting potential issues in connection with engagement between a wire bonding tool and an ultrasonic transducer of a wire bonding machine is provided. The method includes the steps of: (a) determining acceptable criteria for an electrical characteristic of an ultrasonic transducer; (b) applying an electrical current to the ultrasonic transducer; and (c) determining if the electrical characteristic of the ultrasonic transducer is acceptable after step (b).

According to yet another exemplary embodiment of the invention, a method of detecting potential issues in connection with engagement between a wire bonding tool and an ultrasonic transducer of a wire bonding machine is provided. The method includes the steps of: (a) determining acceptable criteria for an impedance characteristic of an ultrasonic transducer; (b) applying an electrical current to the ultrasonic transducer; and (c) determining if the impedance characteristic of the ultrasonic transducer is acceptable after step (b).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures.

DETAILED DESCRIPTION

In accordance with certain exemplary embodiments of the invention, a "health check" for robustness of wire bonding tool gripping (i.e., connection) with an ultrasonic transducer is provided.

More specifically, in accordance with certain exemplary embodiments of the invention, new methods of using (i) an electrical characteristic of an ultrasonic transducer (e.g., impedance of the transducer) versus (ii) an electrical power signal applied to the transducer (e.g., electrical current) are provided to check the clamping robustness between (a) a wire bonding tool and (b) the ultrasonic transducer. Such methods may be used, for example, to detect subtle abnormalities such as improper screw torque, a worn wire bonding tool screw, worn transducer clamp hole, worn transducer clamp thread, wire bonding tool (e.g., capillary) non-conformances, or the use of unauthorized third-party wire bonding tool screws, which all manifest as a reduced (or undesirable) gripping force on the wire bonding tool (e.g., capillary). Such methods may be implemented, for example, each time a wire bonding tool is replaced (or at some predetermined interval) since this is when a variation in gripping force often occurs.

Aspects of the invention may reduce yield loss of bonded semiconductor packages which may result, for example, after a wire bonding tool (e.g., capillary) change that may cause a degradation of the wire bonding tool gripping force. According to aspects of the invention, such a loss of gripping force may manifest itself as a change in process parameters (e.g., higher μm/mA gain) resulting in de-centering of process windows.

Exemplary aspects of the invention aggregate impedance data (or other electrical characteristic data) of the ultrasonic transducer at many different electrical current operating points (e.g., from the lowest to the highest specification range of the ultrasonic transducer) to measure the instantaneous change in impedance (or other electrical characteristics). For example, when the clamping force is overcome by high capillary accelerations at an ultrasonic drive frequency, a loss of gripping may occur—and may result in an incrementally higher impedance with increasing current (in other words, a "parabolic response" that is more obvious to detect).

In a specific exemplary embodiment of the invention, ultrasonic transducer impedance versus electrical current applied to the transducer is used for the detection of clamping force degradation (i.e., degradation of the clamping force of the wire bonding tool secured within the aperture of the transducer).

Figure 1A:
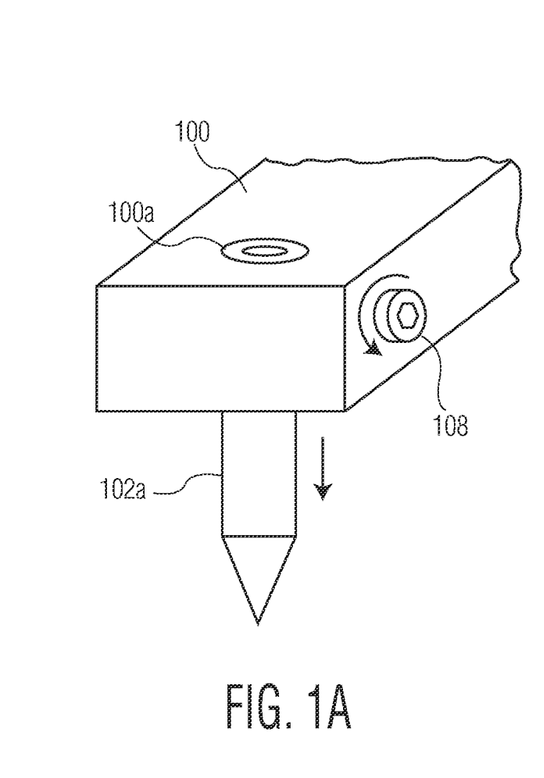
FIGS. 1A-1D are a series of block diagrams illustrating the removal of a wire bonding tool from an ultrasonic transducer, the installation of a new wire bonding tool with the ultrasonic transducer, and the detection of potential issues in connection with the engagement between the new wire bonding tool and the ultrasonic transducer, according to an exemplary embodiment of the invention.
Figure 1B:
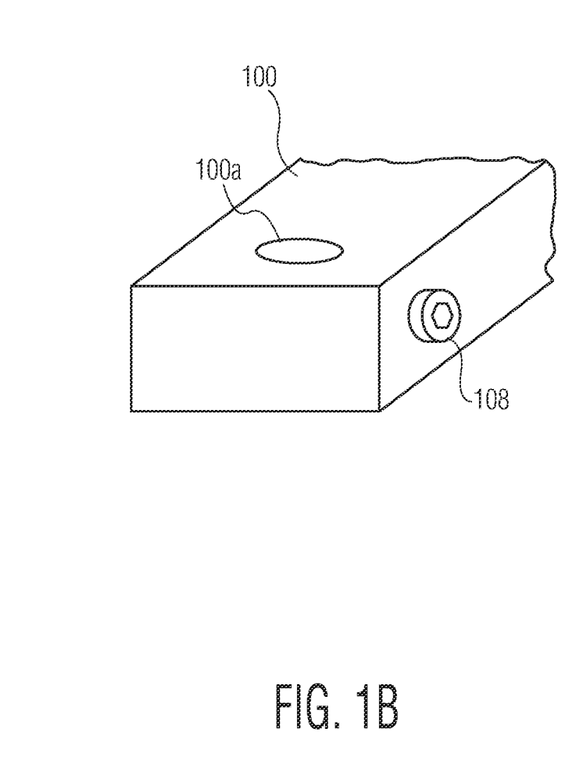
Figure 1C:
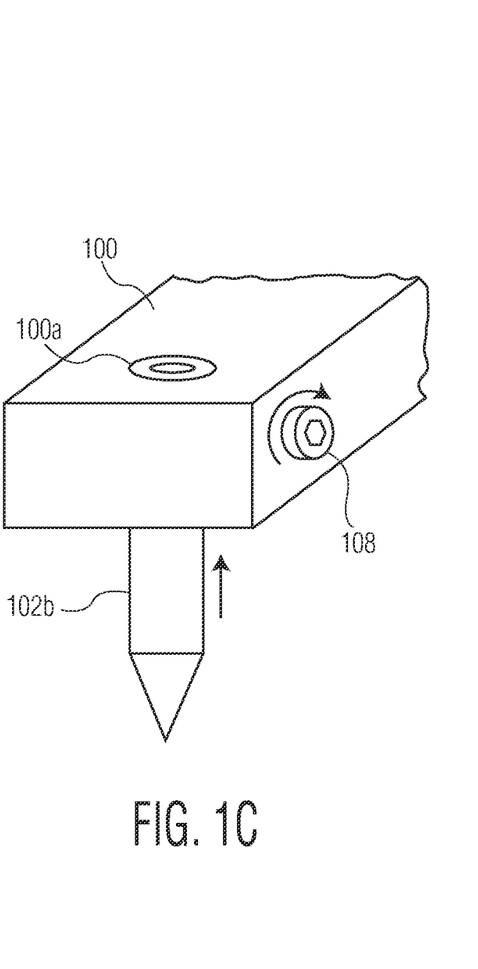
Figure 1D:
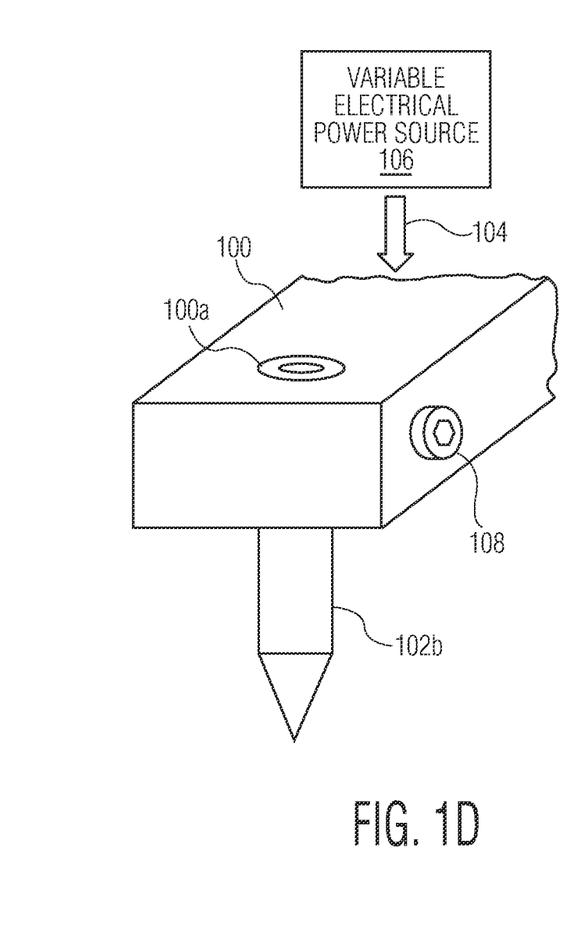

Referring now to FIGS. 1A-1D, FIG. 1A illustrates a worn wire bonding tool 102a (e.g., a capillary tool) engaged in an aperture 100a of an ultrasonic transducer 100, where worn wire bonding tool 102a needs to be replaced. Aperture 100a (e.g., a clamp hole) is defined by ultrasonic transducer 100 and is tightened by an engagement mechanism 108 (e.g., a screw or other engagement mechanism). FIG. 1A illustrates loosening of engagement mechanism 108 (i.e., through counterclockwise rotation), and lowering of wire bonding tool 102a. FIG. 1B illustrates the worn wire bonding tool 102a having been removed from aperture 100a. FIG. 1C illustrates a new wire bonding tool 102b having been installed in aperture 100a of ultrasonic transducer 100. More specifically, FIG. 1C illustrates engagement of new wire bonding tool 102b with aperture 100a, and tightening of engagement mechanism 108 (i.e., through clockwise rotation). With this installation of new wire bonding tool 102b, one of the inventive methods of detecting potential issues in connection with the engagement between new wire bonding tool 102b and ultrasonic transducer 100 may be utilized. FIG. 1D illustrates an electrical signal 104 (e.g., electrical power, electrical current, etc.) being applied by a variable electrical power source 106 to detect potential connection issues (e.g., to determine the current response of ultrasonic transducer 100 at resonance for the calculation of impedance, to determine an electrical/impedance characteristic at each of a plurality of levels of electrical power/current, etc.).

Figure 2:
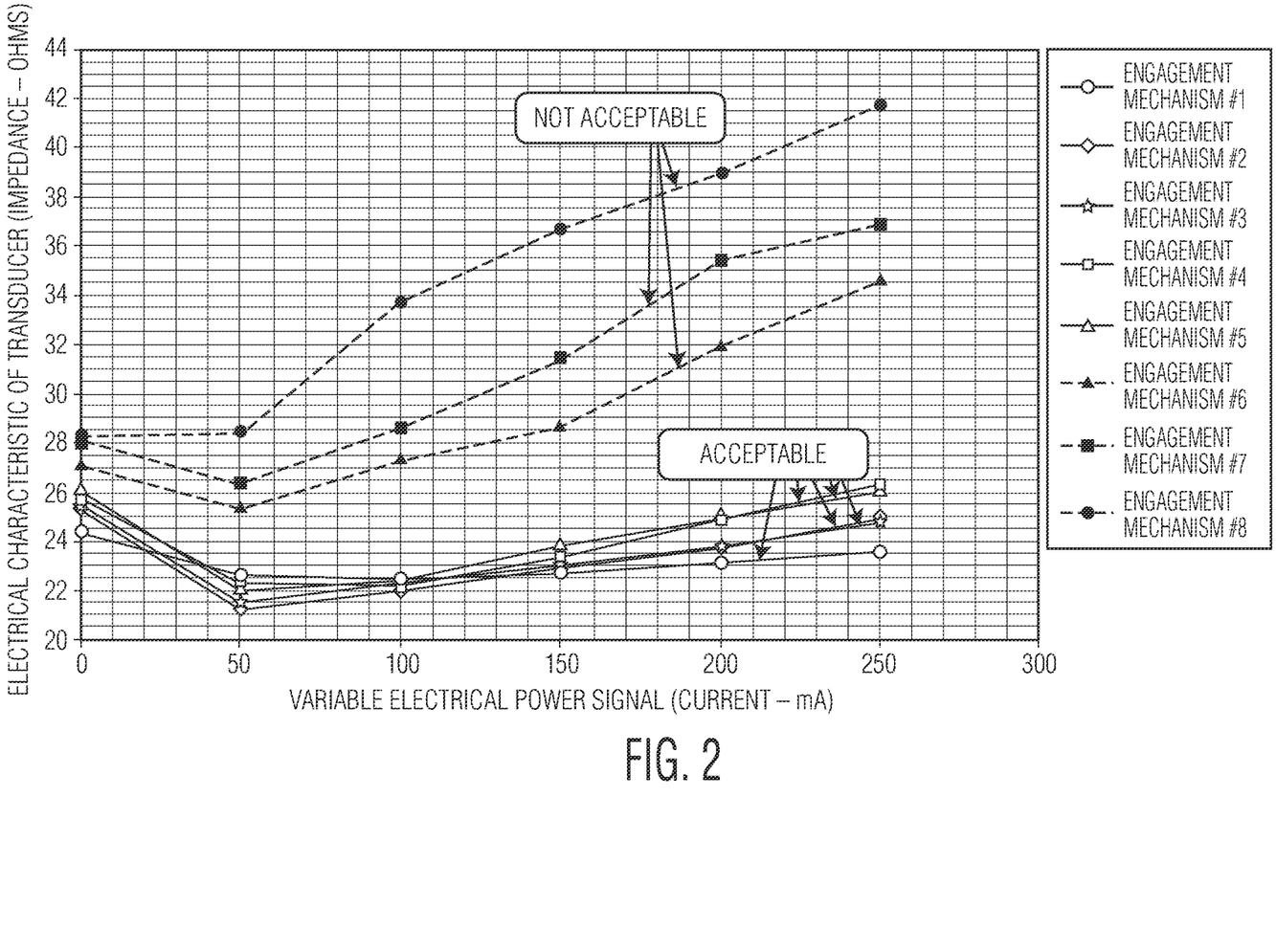
FIG. 2 is a plot of transducer current versus transducer impedance useful for detecting potential issues in connection with engagement between a wire bonding tool and an ultrasonic transducer of a wire bonding machine, according to an exemplary embodiment of the invention.

FIG. 2 is an exemplary plot of (i) electrical current applied to a transducer versus (ii) the impedance of the transducer, used to detect potential issues in connection with the engagement between various wire bonding tools (i.e., engagement mechanisms 1-8) and the ultrasonic transducer. In this illustration, one of the inventive methods has been applied to investigate the performance of various engagement mechanisms. For example, an "engagement mechanism" may be: a brand new screw installed for the first time; an existing screw that has been used for some time in the past; a screw designed for the transducer by the OEM; a third party screw (e.g., a screw produced by an unauthorized third party not associated with the OEM); etc. For each of these various engagement mechanisms, there is an indication of whether the associated coupling between transducer and the wire bonding tool is acceptable (e.g., determined by considering if an electrical characteristic, such as impedance of the transducer, is acceptable at each of a plurality of levels of electrical power/current).

Specifically referring now to FIG. 2: engagement mechanism #1 is an example of a brand new screw designed for the transducer by the OEM, with acceptable coupling; engagement mechanism #2 is an example of a used screw (e.g., a screw after ten wire bonding tool changes) designed for the transducer by the OEM, with acceptable coupling; engagement mechanism #3 is an example of a used screw (e.g., a screw after twenty wire bonding tool changes) designed for the transducer by the OEM, with acceptable coupling; engagement mechanism #4 is an example of a used screw (e.g., a screw after fifty wire bonding tool changes) designed for the transducer by the OEM, with acceptable coupling; engagement mechanism #5 is an example of a used screw (e.g., a screw after one hundred wire bonding tool changes) designed for the transducer by the OEM, with acceptable coupling; engagement mechanism #6 is an example of a used screw (e.g., a screw after ten wire bonding tool changes) provided by an unauthorized third party (not by the OEM), with unacceptable coupling; engagement mechanism #7 is an example of a used screw (e.g., a screw after twenty wire bonding tool changes) provided by an unauthorized third party (not by the OEM), with unacceptable coupling; and engagement mechanism #8 is an example of a used screw (e.g., a screw after fifty wire bonding tool changes) provided by an unauthorized third party (not by the OEM), with unacceptable coupling.

The resultant plot of FIG. 2 shows that, for the acceptable engagement mechanisms (e.g., OEM screws indicated by the solid lines on the plot), all impedances fall within an acceptable range (e.g., less than a 5 ohm impedance change across the various current levels). In other words, engagement mechanisms #1-5 are considered "acceptable".

However, for the "not acceptable" engagement mechanisms (e.g., unauthorized third-party screws indicated by the dotted lines on the plot), after a small number of inserts (e.g., ten uses, etc.), the impedance values do not fall within an acceptable range. Thus, an indication (e.g., alarm) may be provided indicating that the electrical characteristic of the ultrasonic transducer (e.g., the transducer impedance) is considered "not acceptable" (e.g., not within an acceptable range for at least one of the plurality of levels of electrical power). In other words, engagement mechanisms #6-8 are considered "not acceptable".

FIGS. 3-6 are flow diagrams illustrating methods of detecting potential issues in connection with engagement between a wire bonding tool and an ultrasonic transducer of a wire bonding machine. As is understood by those skilled in the art, certain steps included in the flow diagrams may be omitted; certain additional steps may be added; and the order of the steps may be altered from the order illustrated—all within the scope of the invention.

Figure 3:
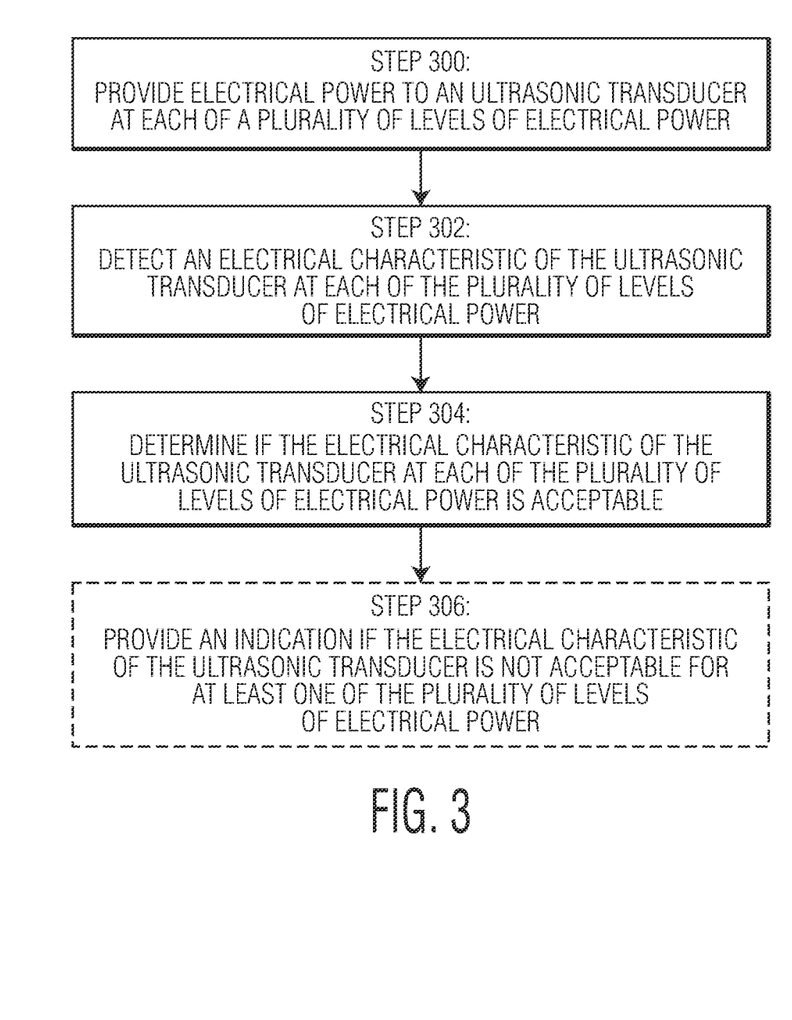
FIGS. 3-6 are flow diagrams illustrating methods of detecting potential issues in connection with engagement between a wire bonding tool and an ultrasonic transducer of a wire bonding machine, according to various exemplary embodiments of the invention.

Referring now to FIG. 3, at Step 300, electrical power is provided to an ultrasonic transducer at each of a plurality of levels of electrical power (e.g., at a plurality of different levels of electrical current). At Step 302, an electrical characteristic of the ultrasonic transducer is detected at each of the plurality of levels of electrical power (e.g., the electrical characteristic of the ultrasonic transducer is related to an impedance of the ultrasonic transducer). At Step 304, a determination is made as to whether the electrical characteristic of the ultrasonic transducer at each of the plurality of levels of electrical power is acceptable (e.g., by comparing the detected characteristic, such as impedance, to some acceptable criteria). At optional Step 306, an indication is provided if the electrical characteristic of the ultrasonic transducer is not acceptable for at least one of the plurality of levels of electrical power. Each of Steps 300, 302, and 304 may be performed each time a wire bonding tool on a wire bonding machine is changed, or at a predetermined interval. The indication provided in Step 306 may be an alarm on a wire bonding machine and/or information provided to an operator of the wire bonding machine. The indication provided in Step 306 may provide instructions for checking at least one of: (i) screw torque of a screw holding a wire bonding tool in place in connection with the ultrasonic transducer; (ii) screw wear or other damage of the screw; (iii) wear related to a clamp hole of the ultrasonic transducer; (iv) wear related to a clamp thread of the ultrasonic transducer; (v) a non-conformity of the wire bonding tool; and (vi) use of an unauthorized screw holding the wire bonding tool in place in connection with the ultrasonic transducer.

Figure 4:
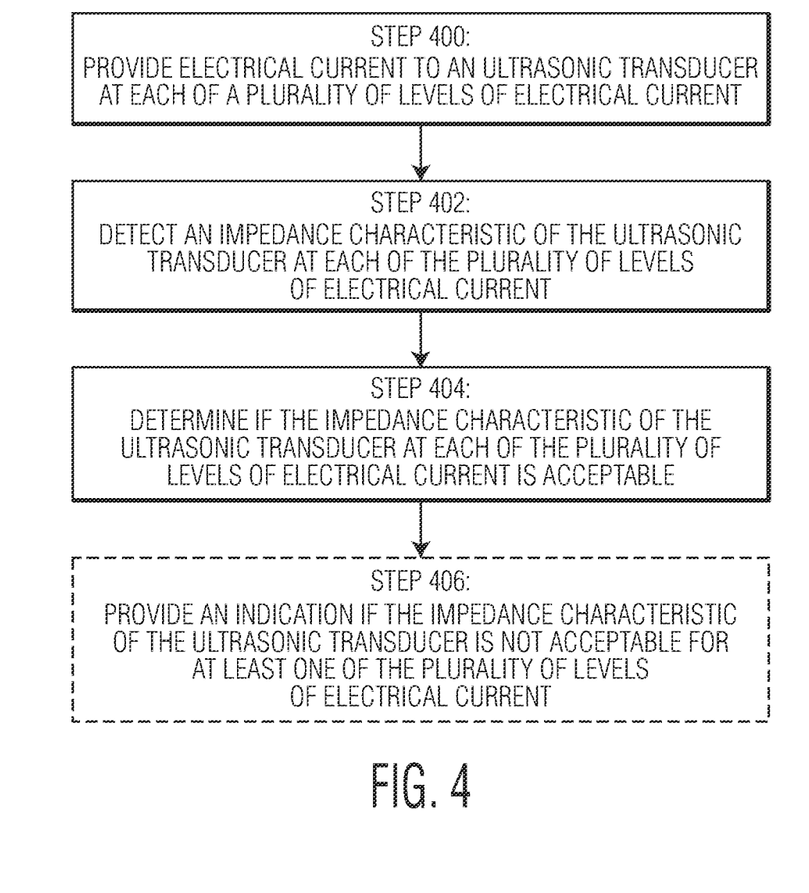

Referring now to FIG. 4, at Step 400, electrical current is provided to an ultrasonic transducer at each of a plurality of levels of electrical current. At Step 402, an impedance characteristic of the ultrasonic transducer is detected at each of the plurality of levels of electrical current. At Step 404, a determination is made as to whether the impedance characteristic of the ultrasonic transducer at each of the plurality of levels of electrical current is acceptable. At optional Step 406, an indication is provided if the impedance characteristic of the ultrasonic transducer is not acceptable for at least one of the plurality of levels of electrical current. Each of Steps 400, 402, and 404 may be performed each time a wire bonding tool on a wire bonding machine is changed, or at a predetermined interval. The indication provided in Step 406 may be an alarm on a wire bonding machine and/or information provided to an operator of the wire bonding machine. The indication provided in Step 406 may provide instructions for checking at least one of: (i) screw torque of a screw holding a wire bonding tool in place in connection with the ultrasonic transducer; (ii) screw wear or other damage of the screw; (iii) wear related to a clamp hole of the ultrasonic transducer; (iv) wear related to a clamp thread of the ultrasonic transducer; (v) a non-conformity of the wire bonding tool; and (vi) use of an unauthorized screw holding the wire bonding tool in place in connection with the ultrasonic transducer.

Figure 5:
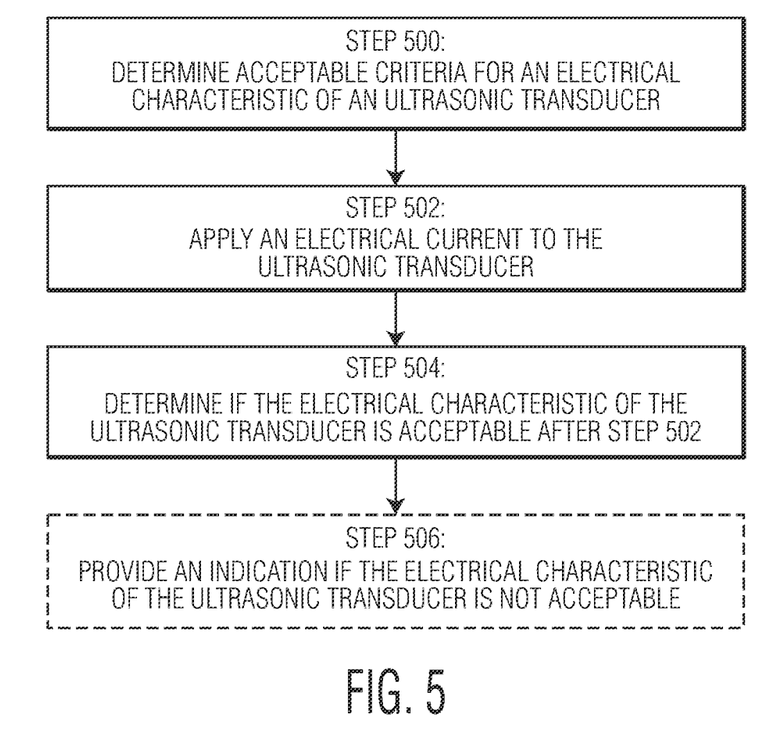

Referring now to FIG. 5, at Step 500, acceptable criteria are determined for an electrical characteristic of an ultrasonic transducer (e.g., an electrical characteristic of the ultrasonic transducer that is related to an impedance of the ultrasonic transducer). At Step 502, an electrical current is applied to the ultrasonic transducer. At Step 504, a determination is made as to whether the electrical characteristic of the ultrasonic transducer is acceptable after Step 502. At optional Step 506, an indication is provided if the electrical characteristic of the ultrasonic transducer is not acceptable. Each of Steps 500, 502, and 504 may be performed each time a wire bonding tool on a wire bonding machine is changed, or at a predetermined interval. The indication provided in Step 506 may be an alarm on a wire bonding machine and/or information provided to an operator of the wire bonding machine. The indication provided in Step 506 may provide instructions for checking at least one of: (i) screw torque of a screw holding a wire bonding tool in place in connection with the ultrasonic transducer; (ii) screw wear or other damage of the screw; (iii) wear related to a clamp hole of the ultrasonic transducer; (iv) wear related to a clamp thread of the ultrasonic transducer; (v) a non-conformity of the wire bonding tool; and (vi) use of an unauthorized screw holding the wire bonding tool in place in connection with the ultrasonic transducer.

Figure 6:
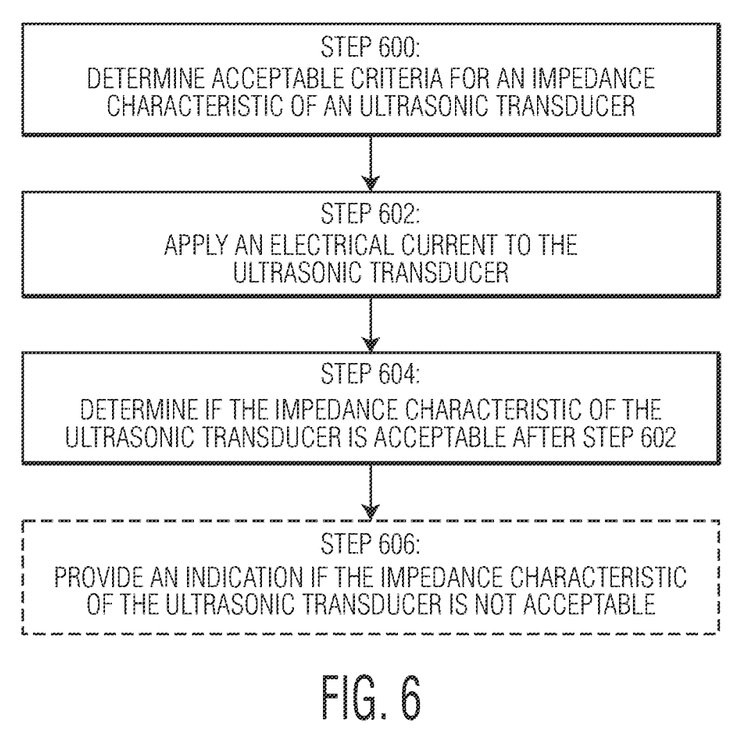

Referring now to FIG. 6, at Step 600, acceptable criteria are determined for an impedance characteristic of an ultrasonic transducer. At Step 602, an electrical current is applied to an ultrasonic transducer. At Step 604, a determination is made as to whether the impedance characteristic of the ultrasonic transducer is acceptable after Step 602. At optional Step 606, an indication is provided if the impedance characteristic of the ultrasonic transducer is not acceptable. Each of Steps 600, 602, and 604 may be performed each time a wire bonding tool on a wire bonding machine is changed, or at a predetermined interval. The indication provided in Step 606 may be an alarm on a wire bonding machine and/or information provided to an operator of the wire bonding machine. The indication provided in Step 606 may provide instructions for checking at least one of: (i) screw torque of a screw holding a wire bonding tool in place in connection with the ultrasonic transducer; (ii) screw wear or other damage of the screw; (iii) wear related to a clamp hole of the ultrasonic transducer; (iv) wear related to a clamp thread of the ultrasonic transducer; (v) a non-conformity of the wire bonding tool; and (vi) use of an unauthorized screw holding the wire bonding tool in place in connection with the ultrasonic transducer.

The inventive methods recited herein may be performed at any time, and in connection with any application, as desired. For example, the methods may be performed each time a wire bonding tool is changed. In other examples, the methods may be performed at a predetermined interval (e.g., after a predetermined time, a predetermined number of machine operations, etc.). In related examples, the methods may be performed at various times along the life of a specific engagement mechanism (e.g., screw), for example, when the screw is new (a baseline performance), after 10 wire bonding tool changes, after 20 wire bonding tool changes, etc. Thus, the performance of the engagement mechanism (and its effect on coupling between the ultrasonic transducer and the wire bonding tool) may be considered over the life of the screw.

Although the invention has been described primarily with respect to methods implemented in connection with a wire bonding tool change (e.g., replacing an old tool with a new tool), the invention is not limited thereto. For example, the inventive detection methods may also be utilized at a predetermined interval during a wire bonding operation.

Although the invention is illustrated and described with respect to ball bonding tools (e.g., capillaries), the teachings of the invention may also be applied to other types of wire bonding tools such as wedge bonding tools, ribbon bonding tools, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:
1. A method of detecting potential issues in connection with engagement between a wire bonding tool and an ultrasonic transducer of a wire bonding machine, the method comprising the steps of:

(a) providing electrical power to an ultrasonic transducer at each of a plurality of levels of electrical power;
(b) detecting an electrical characteristic of the ultrasonic transducer at each of the plurality of levels of electrical power; and
(c) checking the clamping between the wire bonding tool and the ultrasonic transducer to detect a reduced gripping force on the wire bonding tool by determining if the electrical characteristic of the ultrasonic transducer at each of the plurality of levels of electrical power is acceptable.

2. The method of claim 1 wherein each of steps (a), (b), and (c) is performed each time after at least one of (i) a wire bonding tool on a wire bonding machine is changed and (ii) a predetermined interval.

3. The method of claim 1 further comprising the step of (d) providing an indication if the electrical characteristic of the ultrasonic transducer is not acceptable for at least one of the plurality of levels of electrical power.

4. The method of claim 3 wherein the indication is an alarm on a wire bonding machine.

5. The method of claim 3 wherein the indication is information provided to an operator of a wire bonding machine.

6. The method of claim 3 wherein the indication provides instructions for checking at least one of: (i) screw torque of a screw holding a wire bonding tool in place in connection with the ultrasonic transducer; (ii) screw wear or other damage of the screw; (iii) wear related to a clamp hole of the ultrasonic transducer; (iv) wear related to a clamp thread of the ultrasonic transducer; (v) a non-conformity of the wire bonding tool; and (vi) use of an unauthorized screw holding the wire bonding tool in place in connection with the ultrasonic transducer.

7. The method of claim 1 wherein the electrical power provided to the ultrasonic transducer is electrical power provided at a plurality of different levels of electrical current.

8. The method of claim 1 wherein the electrical characteristic of the ultrasonic transducer is related to an impedance of the ultrasonic transducer.

9. A method of detecting potential issues in connection with engagement between a wire bonding tool and an ultrasonic transducer of a wire bonding machine, the method comprising the steps of:
(a) providing electrical current to an ultrasonic transducer at each of a plurality of levels of electrical current;
(b) detecting an impedance characteristic of the ultrasonic transducer at each of the plurality of levels of electrical current; and
(c) detecting degradation of a clamping force of the wire bonding tool secured within an aperture of the ultrasonic transducer by determining if the impedance characteristic of the ultrasonic transducer at each of the plurality of levels of electrical current is acceptable.

10. The method of claim 9 wherein each of steps (a), (b), and (c) is performed each time after at least one of (i) a wire bonding tool on a wire bonding machine is changed and (ii) a predetermined interval.

11. The method of claim 9 further comprising the step of (d) providing an indication if the impedance characteristic of the ultrasonic transducer is not acceptable for at least one of the plurality of levels of electrical current.

12. The method of claim 11 wherein the indication is an alarm on a wire bonding machine.

13. The method of claim 11 wherein the indication is information provided to an operator of a wire bonding machine.

14. The method of claim 11 wherein the indication provides instructions for checking at least one of: (i) screw torque of a screw holding a wire bonding tool in place in connection with the ultrasonic transducer; (ii) screw wear or damage of the screw; (iii) wear related to a clamp hole of the ultrasonic transducer; (iv) wear related to a clamp thread of the ultrasonic transducer; (v) a non-conformity of the wire bonding tool; and (vi) use of an unauthorized screw holding the wire bonding tool in place in connection with the ultrasonic transducer.

15. A method of detecting potential issues in connection with engagement between a wire bonding tool and an ultrasonic transducer of a wire bonding machine, the method comprising the steps of:
(a) determining acceptable criteria for an electrical characteristic of an ultrasonic transducer for checking clamping between the wire bonding tool and the ultrasonic transducer;
(b) applying an electrical current to the ultrasonic transducer; and
(c) determining if the electrical characteristic of the ultrasonic transducer is acceptable after step (b) to detect a reduced gripping force on the wire bonding tool.

16. The method of claim 15 wherein each of steps (a), (b), and (c) is performed each time after at least one of (i) a wire bonding tool on a wire bonding machine is changed and (ii) a predetermined interval.

17. The method of claim 15 further comprising the step of (d) providing an indication if the electrical characteristic of the ultrasonic transducer is not acceptable.

18. The method of claim 15 wherein the electrical characteristic of the ultrasonic transducer is related to an impedance of the ultrasonic transducer.

19. A method of detecting potential issues in connection with engagement between a wire bonding tool and an ultrasonic transducer of a wire bonding machine, the method comprising the steps of:
(a) determining acceptable criteria for an impedance characteristic of an ultrasonic transducer for checking clamping between the wire bonding tool and the ultrasonic transducer;
(b) applying an electrical current to the ultrasonic transducer; and
(c) determining if the impedance characteristic of the ultrasonic transducer is acceptable after step (b) for detecting degradation of a clamping force of the wire bonding tool secured within an aperture of the ultrasonic transducer.

20. The method of claim 19 wherein each of steps (a), (b), and (c) is performed each time after at least one of (i) a wire bonding tool on a wire bonding machine is changed and (ii) a predetermined interval.

21. The method of claim 19 further comprising the step of (d) providing an indication if the impedance characteristic of an ultrasonic transducer is not acceptable.

* * * * *